US008007885B2

(12) United States Patent
Topoulos

(10) Patent No.: US 8,007,885 B2
(45) Date of Patent: Aug. 30, 2011

(54) LIGHT-EMITTING DIODE ASSEMBLY HOUSING COMPRISING POLY(CYCLOHEXANEDIMETHANOL TEREPHTHALATE) COMPOSITIONS

(76) Inventor: Georgios Topoulos, Geneva (CH)

( * ) Notice: Subject to any disclaimer, the term of this patent is extended or adjusted under 35 U.S.C. 154(b) by 989 days.

(21) Appl. No.: 11/517,110

(22) Filed: Sep. 7, 2006

(65) Prior Publication Data

US 2007/0213458 A1 Sep. 13, 2007

Related U.S. Application Data

(60) Provisional application No. 60/716,877, filed on Sep. 14, 2005.

(51) Int. Cl.
*B29D 22/00* (2006.01)
*B01F 17/00* (2006.01)
*C08G 63/60* (2006.01)

(52) U.S. Cl. .......... 428/35.7; 524/431; 524/605

(58) Field of Classification Search .......... 524/497, 524/601, 605, 431; 428/35.7, 405; 528/307, 528/308
See application file for complete search history.

(56) References Cited

U.S. PATENT DOCUMENTS

| 4,753,980 | A | | 6/1988 | Deyrup | |
|---|---|---|---|---|---|
| 4,859,732 | A | * | 8/1989 | Minnick | 524/385 |
| 4,999,055 | A | * | 3/1991 | Holtzen et al. | 106/436 |
| 5,256,787 | A | * | 10/1993 | Borzatta et al. | 546/187 |
| 5,707,437 | A | * | 1/1998 | Niedenzu et al. | 106/446 |
| 5,965,261 | A | * | 10/1999 | Webster | 428/364 |
| 6,197,873 | B1 | * | 3/2001 | Miyata et al. | 524/505 |
| 6,236,061 | B1 | | 5/2001 | Walpita | |
| 2004/0156213 | A1 | * | 8/2004 | Lodhie | 362/555 |
| 2005/0043483 | A1 | * | 2/2005 | Kim et al. | 525/64 |
| 2006/0230553 | A1 | * | 10/2006 | Thullen et al. | 8/564 |

FOREIGN PATENT DOCUMENTS

EP 684 648 B1 9/2000
JP 2005038661 7/1993

OTHER PUBLICATIONS

Temple C. Patton "Pigment Handbook vol. II: Applications and Markets", John Wiley & Sons, New York , pp. *** (1973).*
Patent Abstracts of Japan—Publication No. 2005038661, Feb. 10, 2005, Konica Minolta Holdings Inc.
Patent Abstracts of Japan—Publication No. 55027335, Feb. 27, 1980, Teijin Ltd.

* cited by examiner

*Primary Examiner* — Basia Ridley
*Assistant Examiner* — Alexander C Kollias
(74) *Attorney, Agent, or Firm* — Dority & Manning, P.A.

(57) ABSTRACT

Light-emitting diode assembly housing comprising high temperature poly(1,4-cyclohexanedimethanol terephthalate) compositions containing titanium dioxide.

23 Claims, No Drawings

LIGHT-EMITTING DIODE ASSEMBLY HOUSING COMPRISING POLY(CYCLOHEXANEDIMETHANOL TEREPHTHALATE) COMPOSITIONS

CROSS REFERENCE TO RELATED APPLICATIONS

This application claims the benefit of priority to U.S. Provisional Application No. 60/716,877, filed Sep. 14, 2005.

FIELD OF THE INVENTION

The present invention relates to light emitting diode assembly components comprising poly(1,4-cyclohexanedimethanol terephthalate) (PCT) compositions containing titanium dioxide.

BACKGROUND OF THE INVENTION

Light-emitting semiconductor diodes (LED's) are increasingly being used as light sources in numerous applications due to their many advantages over traditional light sources. LED's generally consume significantly less power than incandescent and other light sources, require a low voltage to operate, are resistant to mechanical shock, require low maintenance, and generate minimal heat when operating. As a result, they are displacing incandescent and other light sources in many uses and have found applications in such disparate areas as traffic signals, large area displays (including video displays), interior and exterior lighting, cellular telephone displays, automotive displays, and flashlights.

LED's are typically used in such applications as components in assemblies. LED assemblies comprise a housing partially surrounding at least one LED and an electrical connection between the diode and an electrical circuit. The assembly may further comprise a lens that is adhered to the housing and that fully or partially covers the LED and serves to focus the light emitted by the LED.

It would be desirable to make LED housings from polymeric materials, as such materials may be injection molded and offer considerable design flexibility. However, useful polymeric compositions would preferably satisfy a number of conditions. Since many LED assemblies are attached to circuits boards using reflow oven welding processes that operate at elevated temperatures, useful compositions would be sufficiently heat resistant to withstand the welding conditions and minimal surface blistering of the housing during the welding process. Useful compositions would further preferably exhibit good whiteness/reflectivity to maximize the amount of light reflected by the housing, have good ultraviolet light resistance, good long-term resistance to the operating temperatures of the LED assembly, and have good adhesion to any lens material used. The poly(1,4-cyclohexanedimethanol terephthalate) compositions used in the present invention satisfy the foregoing requirements.

WO 03/085029 discloses a polyamide resin composition useful in the production of light-emitting diode reflectors. However, polyamides often do not have good color retention upon exposure to ultraviolet light or heat.

SUMMARY OF THE INVENTION

There is disclosed herein a light-emitting diode assembly housing comprising a poly(1,4-cyclohexanedimethanol terephthalate) composition, comprising:
(a) about 40 to about 95 weight percent poly(1,4-cyclohexanedimethanol terephthalate); and
(b) about 5 to about 60 weight percent of titanium dioxide;
(c) 0 to about 40 weight percent of at least one inorganic reinforcing agent or filler; and
(d) 0 to about 3 weight percent of at least one oxidative stabilizer,
wherein the weight percentages are based on the total weight of the composition.

DETAILED DESCRIPTION OF THE INVENTION

As used herein, by the terms "light-emitting diode assembly" or "LED assembly" is meant a device comprising at least one light-emitting semiconductor diode, an electrical connection capable of connecting the diode to an electrical circuit, and a housing partially surrounding the diode. The LED assembly may optionally have a lens that fully or partially covers the LED.

The LED assembly housing comprises a poly(1,4-cyclohexanedimethanol terephthalate) (PCT) composition comprising titanium dioxide.

By "poly(1,4-cyclohexanedimethanol terephthalate)" (PCT) is meant a polyester formed from a diol and a dicarboxylic acid. At least about 80 mole percent, more preferably at least about 90 mole percent, and especially preferably all of the diol repeat units are derived from 1,4-cyclohexanedimethanol and are of formula (I).

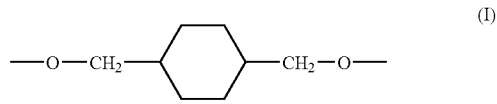

At least about 80 mole percent, more preferably at least about 90 mole percent, and especially preferably all of the dicarboxylic acid repeat units are derived from terephthalic acid and are of formula (II).

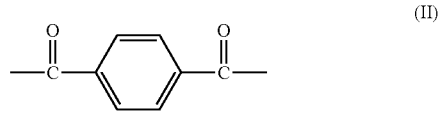

The PCT may also contain up to 10 mole percent (based on the total amount of (I) and (II) present) of one or more repeat unit derived from hydroxycarboxylic acids, although it is preferred that no such repeat unit be present. One particular preferred PCT contains (I) as the diol repeat unit, (II) is 95 mole percent of dicarboxylic acid repeat unit and the other 5 mole percent of the dicarboxylic repeat unit is derived from isophthalic acid, and no repeat units derived from hydroxycarboxylic acid are present. The PCT is present in from about 40 to about 95 weight percent of the composition, or preferably about 50 to about 85 weight percent, based on the total weight of the composition.

The compositions may optionally contain up to about 70 weight percent, or more preferably about 1 to about 40 weight percent of other thermoplastic polymers, such as other thermoplastic polyesters (such as poly(ethylene terephthalate), poly(propylene terephthalate), poly(butylene terephthalate), poly(naphthalene terephthalate), and the like), liquid crystalline polyesters, and the like, wherein the weight percentages are based on the total weight of PCT and other thermoplastic polymer.

The titanium dioxide used in the compositions may be any sort, but is preferably in the rutile form. The titanium dioxide comprises about 5 to about 60 weight percent, or preferably about 15 to about 50 weight percent, or more preferably about 20 to about 40 weight percent of the total composition.

The surface of the titanium dioxide particles will preferably be coated. The titanium dioxide will preferably be first coated with an inorganic coating and then an organic coating that is applied over the inorganic coating. The titanium dioxide particles may be coated using any method known in the art. Preferred inorganic coatings include metal oxides. Organic coatings may include one or more of carboxylic acids, polyols, alkanolamines, and/or silicon compounds.

Examples of carboxylic acids suitable for use as an organic coating include adipic acid, terephthalic acid, lauric acid, myristic acid, palmitic acid, stearic acid, polyhydroxystearic acid, oleic acid, salicylic acid, malic acid, and maleic acid. As used herein, the term "carboxylic acid" includes the esters and salts of the carboxylic acids.

Examples of silicon compounds suitable for an organic coating include, but are not limited to, silicates, organic silanes, and organic siloxanes, including organoalkoxysilanes, aminosilanes, epoxysilanes, mercaptosilanes, and polyhydroxysiloxanes. Suitable silanes can have the formula $R_xSi(R')_{4-x}$ wherein R is a nonhydrolyzable aliphatic, cycloaliphatic, or aromatic group having from 1 to about 20 carbon atoms, and R' is one or more hydrolyzable groups such as an alkoxy, halogen, acetoxy, or hydroxy group, and X is 1, 2, or 3.

Useful suitable silanes suitable for an organic coating include one or more of hexyltrimethoxysilane, octyltriethoxysilane, nonyltriethoxysilane, decyltriethoxysilane, dodecyltriethoxysilane, tridecyltriethoxysilane, tetradecyltriethoxysilane, pentadecyltriethoxysilane, hexadecyltriethoxysilane, heptadecyltriethoxysilane, octadecyltriethoxysilane, N-(2-aminoethyl) 3-aminopropylmethyldimethoxysilane, N-(2-aminoethyl) 3-aminopropyltrimethoxysilane, 3-aminopropyltriethoxysilane, 3-glycidoxypropyltrimethoxysilane, 3-glycidoxypropylmethyldimethoxysilane, 3-mercaptopropyltrimethoxysilane and combinations of two or more thereof. In other useful silanes, R has between 8 and 18 carbon atoms and R' is one or more of chloro, methoxy, ethoxy, or hydroxy groups.

When present, the organic coating preferably comprises about 0.1 to about 10 weight percent, or more preferably about 0.5 to about 7 weight percent, or yet more preferably about 0.5 to about 5 weight percent of the coated titanium dioxide.

Examples of suitable inorganic coatings include metal oxides and hydrous oxides, including oxides and hydrous oxides of silicon, aluminum, zirconium, phosphorous, zinc, rare earth elements, and the like. A preferred metal oxide is alumina.

The inorganic coating preferably comprises about 0.25 to about 50 weight percent, or more preferably about 1.0 to about 25 weight percent, or yet more preferably about 2 to about 20 weight percent of the coated titanium dioxide.

The compositions may optionally contain up to about 40 weight percent of one or more inorganic reinforcing agents and/or fillers. Example of suitable reinforcing agents include glass fibers and minerals, particularly fibrous minerals such as wollastonite. Examples of fillers include calcium carbonate, talc, mica, and kaolin. When present, the reinforcing agent and/or filler is preferably present in about 1 to about 40 weight percent, or more preferably about 1 to about 20 weight percent of the total composition.

The compositions may optionally contain up to about 15 weight percent of one or more polymeric tougheners. The toughener will typically be an elastomer having a relatively low melting point, generally <200° C., preferably <150° C. and that has attached to it functional groups that can react with the PCT (and optionally other polymers present). Since PCT usually have carboxyl and hydroxyl groups present, these functional groups usually can react with carboxyl and/or hydroxyl groups. Examples of such functional groups include epoxy, carboxylic anhydride, hydroxyl (alcohol), carboxyl, and isocyanate. Preferred functional groups are epoxy, and carboxylic anhydride, and epoxy is especially preferred. Such functional groups are usually "attached" to the polymeric tougheners by grafting small molecules onto an already existing polymer or by copolymerizing a monomer containing the desired functional group when the polymeric tougheners molecules are made by copolymerization. As an example of grafting, maleic anhydride may be grafted onto a hydrocarbon rubber using free radical grafting techniques. The resulting grafted polymer has carboxylic anhydride and/or carboxyl groups attached to it. An example of a polymeric tougheners wherein the functional groups are copolymerized into the polymer is a copolymer of ethylene and a (meth) acrylate monomer containing the appropriate functional group. By (meth)acrylate herein is meant the compound may be either an acrylate, a methacrylate, or a mixture of the two. Useful (meth)acrylate functional compounds include (meth) acrylic acid, 2-hydroxyethyl (meth)acrylate, glycidyl (meth) acrylate, and 2-isocyanatoethyl (meth)acrylate. In addition to ethylene and a functional (meth)acrylate monomer, other monomers may be copolymerized into such a polymer, such as vinyl acetate, unfunctionalized (meth)acrylate esters such as ethyl (meth)acrylate, n-butyl (meth)acrylate, and cyclohexyl (meth)acrylate. Preferred toughening agents include those listed in U.S. Pat. No. 4,753,980, which is hereby included by reference. Especially preferred tougheners are copolymers of ethylene, ethyl acrylate or n-butyl acrylate, and glycidyl methacrylate, such as EBAGMA and ethylene/methyl acrylate copolymers.

It is preferred that the polymeric toughener contain about 0.5 to about 20 weight percent of repeat units derived from monomers containing functional groups, preferably about 1.0 to about 15 weight percent, more preferably about 7 to about 13 weight percent of repeat units derived from monomers containing functional groups. There may be more than one type of repeat unit derived from functionalized monomer present in the polymeric toughener. It has been found that toughness of the composition is increased by increasing the amount of polymeric toughener and/or the amount of functional groups. However, these amounts should preferably not be increased to the point that the composition may crosslink, especially before the final part shape is attained.

The polymeric toughener may also be thermoplastic acrylic polymers that are not copolymers of ethylene. The thermoplastic acrylic polymers are made by polymerizing acrylic acid, acrylate esters (such as methyl acrylate, n-propyl acrylate, isopropyl acrylate, n-butyl acrylate, n-hexyl acrylate, and n-octyl acrylate), methacrylic acid, and methacrylate esters (such as methyl methacrylate, n-propyl methacrylate, isopropyl methacrylate, n-butyl methacrylate (BA), isobutyl methacrylate, n-amyl methacrylate, n-octyl methacrylate, glycidyl methacrylate (GMA) and the like). Copolymers derived from two or more of the forgoing types of monomers may also be used, as well as copolymers made by polymerizing one or more of the forgoing types of monomers with styrene, acryonitrile, butadiene, isoprene, and the like. Part or all of the components in these copolymers should preferably have a glass transition temperature of not higher than 0° C. Preferred monomers for the preparation of a thermoplastic acrylic polymer toughening agent are methyl acrylate, n-propyl acrylate, isopropyl acrylate, n-butyl acrylate, n-hexyl acrylate, and n-octyl acrylate.

It is preferred that a thermoplastic acrylic polymer toughening agent have a core-shell structure. The core-shell structure is one in which the core portion preferably has a glass transition temperature of 0° C. or less, while the shell portion is preferably has a glass transition temperature higher than that of the core portion. The core portion may be grafted with silicone. The shell section may be grafted with a low surface energy substrate such as silicone, fluorine, and the like. An acrylic polymer with a core-shell structure that has low surface energy substrates grafted to the surface will aggregate with itself during or after mixing with the thermoplastic polyester and other components of the composition of the invention and can be easily uniformly dispersed in the composition.

When present, the tougheners preferably comprise about 0.5 to about 15 weight percent, or more preferably about 1 to about 10 weight percent, or yet more preferably about 1 to about 5 weight percent, of the total weight of the composition.

The compositions may optionally contain up to about 3 weight percent of one or more oxidative stabilizers. Examples of suitable oxidative stabilizers include phosphite and hypophosphite stabilizers, hindered phenol stabilizers, hindered amine stabilizers, and thioesters. When present, the oxidative stabilizers comprise about 0.1 to about 3 weight percent, or preferably about 0.1 to about 1 weight percent, or more preferably about 0.1 to about 0.6 weight percent, of the total weight of the composition.

The compositions may optionally further contain up to about 3 weight percent of ultraviolet light stabilizers or UV blockers. Examples include triazoles and triazines. When present, the ultraviolet light stabilizers comprise about 0.1 to about 3 weight percent, or preferably about 0.1 to about 1 weight percent, or more preferably about 0.1 to about 0.6 weight percent, of the total weight of the composition.

The compositions are melt-mixed blends, wherein all of the polymeric components are well-dispersed within each other and all of the non-polymeric ingredients are well-dispersed in and bound by the polymer matrix, such that the blend forms a unified whole. Any melt-mixing method may be used to combine the polymeric components and non-polymeric ingredients of the present invention. For example, the polymeric components and non-polymeric ingredients may be added to a melt mixer, such as, for example, a single or twin-screw extruder; a blender; a kneader; or a Banbury mixer, either all at once through a single step addition, or in a stepwise fashion, and then melt-mixed. When adding the polymeric components and non-polymeric ingredients in a stepwise fashion, part of the polymeric components and/or non-polymeric ingredients are first added and melt-mixed with the remaining polymeric components and non-polymeric ingredients being subsequently added and further melt-mixed until a well-mixed composition is obtained.

The LED assembly housing of the present invention may be in the form of a single piece or may be formed by assembling two or more subparts. When it is in the form of a single piece, it is prepared from the PCT composition. When it is formed from two or more subparts, at least one of the parts is prepared from the PCT composition. When it is formed from two or more subparts, one or more of those parts may be metal, ceramic, or a polymeric material other than the PCT composition. The subparts may be connected mechanically, by gluing, or by overmolding a polymeric material over a metal or other polymeric part. The housing or housing subpart prepared from the composition used in the present invention may be formed from the PCT composition by any suitable melt-processing method known to those skilled in the art, such as injection molding or the like. The housing may be overmolded over a metal (such as copper or silver-coated copper) lead frame that can be used to make an electrical connection to an LED inserted into the housing.

The housing preferably has a cavity in the portion of the housing that surrounds the LED, which serves to reflect the LED light in the outward direction and towards a lens, if one is present. The cavity may be in a cylindrical, conical, parabolic or other curved form, and preferably has a smooth surface. Alternatively, the walls of the cavity may be parallel or substantially parallel to the diode. A lens may be formed over the diode cavity and may comprise an epoxy or silicone material.

The housings of the present invention may be incorporated into LED assemblies used in applications such as traffic signals, large area displays (including video displays), video screens, interior and exterior lighting, cellular telephone display backlights, automotive displays, vehicle brake lights, vehicle head lamps, laptop computer display backlights, pedestrian floor illumination, and flashlights.

EXAMPLES

The compositions of Examples 1-5 and Comparative Example 1 were prepared by melt blending the ingredients shown in Table 1 in a 55 mm kneader operating at about 300° C. using a screw speed of about 350 rpm and a melt temperature of about 330° C. Upon exiting the extruder, the compositions were cooled and pelletized.

The following ingredients are shown in Table 1:

PCT is poly(1,4-cyclohexanedimethanol terephthalate).

Polyamide is a copolyamide made from terephthalic acid, adipic acid, and hexamethylenediamine with a melting point of ca. 315° C.

Toughener A is EMAC® SP2260, an ethylene-methyl acrylate copolymer supplied by Eastman Chemical Co., Kingsport, Tenn.

Toughener B is an ethylene/n-butyl acrylate/glycidyl methacrylate terpolymer.

Lubricant is Licowax® PED521, supplied by Clariant Corp., Charlotte, N.C.

Stabilizer A is an epoxy cresol novolac resin.

Stabilizer B is Irgafos® 12, supplied by Ciba, Basel.

Antioxidant A is Irganox® 1010, supplied by Ciba, Basel.

Antioxidant B is Ultranox® 626A, supplied by G.E. Specialty Chemicals, Parkersburg, W. Va.

Antioxidant C is Irganox® 1098, supplied by Ciba, Basel.

Poly(butylene terephthalate) is Crastin® 6136, supplied by E.I. du Pont de Nemours & Co., Wilmington, Del.

Titanium Dioxide A is RCL4 TiO2, supplied by Millenium Inorganic Chemicals, Hunt Valley, Md.

Titanium Dioxide B is P-150, supplied by E.I. du Pont de Nemours & Co., Wilmington, Del.

Zenite® 6000 is a liquid crystalline polyester supplied by E.I. du Pont de Nemours & Co., Wilmington, Del.

Wollastonite is Nayd M200, supplied by Nyco Minerals, Willsboro, N.Y.

The compositions were molded into ISO tensile bars according to ISO method 527-1/2 using a mold temperature of about 100° C. and tensile modulus was determined using the same method. Notched Chary impact strengths were determined following ISO 179/1eA. The results are shown in Table 1.

The whiteness index was determined for each composition using a colorimeter following ISO 11475:2004 and using the CIE D65 daylight illuminant at 10 degrees. Measurements were done on tensile bars that had been heat aged in air for 2 hours at 150° C., 180° C., 200° C., or 230° C. The results are shown in Table 1. Higher numbers indicate better whiteness.

Blistering resistance was determined using a dip soldering test. Bars having a thickness of 0.8 mm were molded according to according to UL Test No. UL-94; 20 mm Vertical Burning Test from the compositions of Examples 1, 2, 4, and 5 were dipped in molten solder to a depth of 15 mm in a Rhesca Co. Ltd. Solder Checker SAT-5100 for 5 or 10 seconds. The bars were used dry-as-molded (DAM) or after conditioning for 168 hours at 85° C. and 85 percent relative humidity (RH). The solder was at a temperature of 255, 260 or 265° C. Upon being removed from the solder, the bars were inspected for surface blisters. The results are given in Table 2.

The ultraviolet (UV) light stability of the color of the compositions was determined by exposing ISO tensile bars to UV radiation. The samples were placed into the test chamber of a tabletop SUNTEST sunlight exposure system supplied by ATLAS Electric Devices Co. wherein they are directly exposed to UV radiation. In one set of samples, the bars were irradiated for 300 h with a filter that cut off radiation having a wavelength of less than 300 nm. The surface temperature of the sample was 40° C. and the distance from the lamp to the sample was 22 cm. In a second set of samples, the bars were irradiated for 48 h without a filter. The surface temperature of the sample was 75° C. and the distance from the lamp to the sample was 4 cm. The second set of conditions was more severe.

After irradiation, the percent reflectance of incident radiation at 630, 520, or 460 nm was measured using a DATACOLOR colorimeter. The colorimeter is calibrated by measuring a black trap and a white tile defined as standards. The results are given in Table 3. Higher percentages indicate better UV stability.

TABLE 1

|  | Example 1 | Example 2 | Example 3 | Example 4 | Example 5 | Comparative Ex. 1 |
|---|---|---|---|---|---|---|
| PCT | 55.58 | 55.51 | 55.58 | 50.58 | 50.58 | — |
| Polyamide | — | — | — | — | — | 59.6 |
| Toughener A | — | 3 | — | — | — | — |
| Toughener B | 2.9 | — | 2.9 | 2.9 | 2.9 | — |
| Talc | 2 | 2 | 2 | 2 | 2 | — |
| Lubricant | 0.5 | 0.5 | 0.5 | 0.5 | 0.5 | — |
| Stabilizer A | 0.5 | 0.5 | 0.5 | 0.5 | 0.5 | — |
| Stabilizer B | — | — | — | — | — | 0.2 |
| Antioxidant A | 0.19 | 0.19 | 0.19 | 0.19 | 0.19 | — |
| Antioxidant B | 0.3 | 0.3 | 0.3 | 0.3 | 0.3 | — |
| Antioxidant C | — | — | — | — | — | 0.2 |
| Poly(butylene terephthalate) | 3 | 3 | 3 | 3 | 3 | — |
| Titanium dioxide A | 30 | 30 | — | 35 | 30 | 20 |
| Titanium dioxide B | — | — | 30 | — | — | — |
| Zenite ® 6000 | 5 | 5 | 5 | — | — | — |
| Wollastonite | — | — | — | — | 10 | 20 |
| Tensile modulus (GPa) | 2.4 | 2.7 | 2.3 | 2.4 | 2.7 | 5.8 |
| Notched Charpy impact strength (kJ/m$^2$) | 2.5 | 3.6 | 2.1 | 3.1 | 2.8 | 1.9 |
| Whiteness index |  |  |  |  |  |  |
| Aged at 150° C. for 2 h | 62 | 67 | 47 | 67 | 65 | 60 |
| Aged at 180° C. for 2 h | 52 | 61 | 34 | 55 | 54 | 39 |
| Aged at 200° C. for 2 h | 44 | 48 | 23 | 46 | 55 | −8 |
| Aged at 230° C. for 2 h | 32 | 37 | 8 | 33 | 33 | −40 |

Ingredient quantities are given in weight percent based on the total weight of the composition.

TABLE 2

| Solder temp (° C.) | Conditioning | Time (sec) | Example 1 | Example 2 | Example 4 | Example 5 |
|---|---|---|---|---|---|---|
| 260 | DAM | 5 | ○ | ○ | ○ | ○ |
| | 85° C./85% RH/168 h | | X | ○ | ○ | ○ |
| | DAM | 10 | ○ | ○ | ○ | ○ |
| | 85° C./85% RH/168 h | | XX | ○ | ○ | ○ |

["○" denotes that no blisters were observed; "X" denotes that blisters having a diameter of less than about 5 mm were observed; and "XX" denotes that blisters having a diameter of greater than about 5 mm were observed.]

TABLE 3

Percent Reflectance

| | | Example 1 | Example 2 | Example 3 | Example 4 | Example 5 | Comparative Ex. 1 |
|---|---|---|---|---|---|---|---|
| Irradiated for 300 h with a filter that cut off radiation <300 nm. Surface temperature of sample = 40° C. Distance from lamp to sample = 22 cm | 630 nm | 92 | 92 | 90 | 92 | 90 | 89 |
| | 520 nm | 88 | 89 | 85 | 89 | 87 | 87 |
| | 460 nm | 82 | 84 | 79 | 86 | 84 | 85 |
| Irradiated for 48 h without a UV filter. Surface temperature of sample = 75° C. Distance from lamp to sample = 4 cm | 630 nm | 84 | 91 | 89 | 90 | 87 | 86 |
| | 520 nm | 79 | 87 | 82 | 86 | 82 | 79 |
| | 460 nm | 72 | 82 | 74 | 82 | 76 | 70 |

The compositions of Examples 1-5 and Comparative Example 1 are molded into light emitting diode assembly housings that contain epoxy lenses. The housings made from the compositions of Examples 1-5 have good resistance to surface blistering when the housing are welded to circuit boards, good adhesion to the epoxy lens. Furthermore, the housings made from the compositions of Examples 1-5 have significantly improved color stability upon exposure to heat than the housings made from the compositions of Comparative Example 1.

What is claimed is:

1. A light-emitting diode housing comprising a poly(1,4-cyclohexanedimethanol terephthalate) composition comprising:
   (a) about 40 to about 95 weight percent poly(1,4-cyclohexanedimethanol terephthalate); and
   (b) about 15 to about 50 weight percent of rutile titanium dioxide;
   (c) 0 to about 40 weight percent of one or more inorganic reinforcing agent and/or one or more inorganic filler;
   (d) 0 to about 3 weight percent of one or more oxidative stabilizer; and
   (e) a polymeric toughener comprising an ethylene/(meth)acrylate copolymer and/or an ethylene, ethyl acrylate or n-butyl acrylate, and glycidyl methacrylate terpolymer;
   wherein the weight percentages are based on the total weight of the composition; and
   wherein the light-emitting diode housing has a cavity that surrounds a light-emitting diode.

2. The housing of claim 1, wherein the cavity has a cylindrical, conical, or parabolic shape.

3. The light-emitting diode housing of claim 1, wherein the cavity defines walls that are parallel to the light-emitting diode.

4. The light-emitting diode housing of claim 1, further comprising a lens formed over the cavity.

5. A light-emitting diode assembly comprising the light-emitting diode housing of claim 1.

6. The light-emitting diode housing of claim 1, wherein the poly(1,4-cyclohexanedimethanol terephthalate) is present from about 50 to about 85 weight percent.

7. The light-emitting diode housing of claim 1, wherein at least 90 mole percent of the diol repeat units of the poly(1,4-cyclohexanedimethanol terephthalate) are derived from 1,4-cyclohexanedimethanol and at least 90 mole percent of the dicarboxylic acid repeat units of poly(1,4-cyclohexanedimethanol terephthalate) are derived from terephthalic acid.

8. The light-emitting diode housing of claim 1, wherein the one or more inorganic filler and/or the one or more inorganic reinforcing agent is selected from the group consisting of glass fibers, wollastonite, calcium carbonate, talc, mica, and kaolin.

9. The light-emitting diode housing of claim 1, wherein the one or more inorganic filler is present from about 5 to about 40 weight percent.

10. The light-emitting diode housing of claim 1, wherein the one or more oxidative stabilizer is selected from the group consisting of phosphite stabilizers, hypophosphite stabilizers, hindered phenol stabilizers, hindered amine stabilizers, thioesters, and aromatic amine stabilizers.

11. The light-emitting diode housing of claim 1, wherein the one or more oxidative stabilizer is present in about 0.1 to about 3 weight percent.

12. The light-emitting diode housing of claim 1, wherein the poly(1,4-cyclohexanedimethanol terephthalate) composition further comprises about 0.1 to about 3 weight percent of ultraviolet light stabilizers, based on the total weight of the poly(1,4-cyclohexanedimethanol terephthalate) composition.

13. The light-emitting diode housing of claim 1, wherein the polymeric toughener is present in an amount from about 0.5 percent to about 15 percent by weight.

14. The light-emitting diode housing of claim 1, wherein both the ethylene/methacrylate copolymer and the ethylene, ethyl acrylate or n-butyl acrylate, and glycidyl methacrylate terpolymer are present in the poly(1,4-cyclohexanedimethanol terephthalate) composition.

15. The light-emitting diode housing of claim 1, wherein the rutile titanium dioxide is present from about 20 to about 40 weight percent.

16. The light-emitting diode housing of claim 1, wherein the rutile titanium dioxide has an inorganic coating.

17. The light-emitting diode housing of claim 16, wherein the inorganic coating comprises alumina.

18. The light-emitting diode housing of claim 1, wherein the rutile titanium dioxide has an inorganic coating and an organic coating.

19. The light-emitting diode housing of claim 18, wherein the inorganic coating is a metal oxide.

20. The light-emitting diode housing of claim 18, wherein the organic coating is one or more selected from the group consisting of carboxylic acids, polyols, alkanolamines, and silicon compounds.

21. The light-emitting diode housing of claim 20, wherein the carboxylic acid is one or more selected from the group consisting of adipic acid, terephthalic acid, lauric acid, myristic acid, palmitic acid, stearic acid, polyhydroxystearic acid, oleic acid, salicylic acid, maleic acid, and maleic acid.

22. The light-emitting diode housing of claim 20, wherein the silicon compound is one or more selected from the group consisting of silicates, organoalkoxysilanes, aminosilanes, epoxysilanes, mercaptosilanes, and polyhydroxysiloxanes.

23. The light-emitting diode housing of claim 22, wherein the silicon compound is one or more selected from the group consisting of hexyltrimethoxysilane, octyltriethoxysilane, nonyltriethoxysilane, decyltriethoxysilane, dodecyltriethoxysilane, tridecyltriethoxysilane, tetradecyltriethoxysilane, pentadecyltriethoxysilane, hexadecyltriethoxysilane, heptadecyltriethoxysilane, octadecyltriethoxysilane, N-(2-aminoethyl) 3-aminopropyimethyldimethoxysilane, N-(2-aminoethyl) 3-aminopropyltrimethoxysilane, 3-aminopropyltriethoxysilane, 3-glycidoxypropyltrimethoxysilane, 3-glycidoxypropylmethyldimethoxysilane, and 3-mercaptopropyltrimethoxysilane.

* * * * *